US 11,043,657 B1

(12) United States Patent
Chen

(10) Patent No.: US 11,043,657 B1
(45) Date of Patent: Jun. 22, 2021

(54) DISPLAY PANEL, MASK, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: E Chen, Wuhan (CN)

(*) Notice: Subject to any disclaimer, the term of this patent is extended or adjusted under 35 U.S.C. 154(b) by 321 days.

(21) Appl. No.: 16/339,365

(22) PCT Filed: Mar. 11, 2019

(86) PCT No.: PCT/CN2019/077628
§ 371 (c)(1),
(2) Date: Apr. 4, 2019

(87) PCT Pub. No.: WO2020/113836
PCT Pub. Date: Jun. 11, 2020

(30) Foreign Application Priority Data

Dec. 6, 2018 (CN) .......................... 201811484358.0

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3244* (2013.01); *H01L 51/0097* (2013.01); *H01L 2251/5338* (2013.01); *H01L 2251/566* (2013.01)

(58) Field of Classification Search
None
See application file for complete search history.

(56) References Cited

U.S. PATENT DOCUMENTS

| 2017/0359899 A1 | 12/2017 | Heo et al. |
| 2019/0181362 A1* | 6/2019 | Tian ........................ B32B 3/266 |
| 2019/0333972 A1* | 10/2019 | Ding .................... H01L 27/127 |

FOREIGN PATENT DOCUMENTS

| CN | 206069987 U | 4/2017 |
| CN | 106783933 A | 5/2017 |
| CN | 107910296 A | 4/2018 |
| CN | 108666347 A | 10/2018 |

* cited by examiner

*Primary Examiner* — J. E. Schoenholtz

(57) ABSTRACT

A display panel, a mask, and a display device are provided. The display panel includes a substrate, a first flexible layer, a first inorganic layer, and a second inorganic layer stacked from bottom to top. A crack blocking structure is disposed on the first flexible layer, and the crack blocking structure includes a cutting portion and a concave portion located at two sides of the cutting portion. The first inorganic layer and the second inorganic layer are disconnected at an opening of the concave portion. The concave portion is configured to block cracks of the first inorganic layer and the second inorganic layer from extending to two sides of the crack blocking structure when the cutting portion cuts the display panel.

20 Claims, 5 Drawing Sheets

DISPLAY PANEL, MASK, AND DISPLAY DEVICE

FIELD OF INVENTION

The present disclosure relates to a field of display technologies, and in particular, to a display panel, a mask, and a display device.

BACKGROUND OF INVENTION

In recent years, compared to traditional liquid crystal displays (LCDs), the advantages of having high contrast, wide viewing angles, and bendability of active matrix organic light-emitting diode (AMOLED) have received more and more attention and research.

In prior art, a mask is usually used to make a display panel, and the mask of a conventional structure needs to strictly control positional accuracy and occlusion problems during preparation and use. When some units exceed technical specifications, the mask needs to be replaced. Thus, the manufacturing process is more complicated. On the other hand, the mask has a shorter service life and a higher production cost.

Therefore, the prior art has drawbacks and is in urgent need of improvement.

SUMMARY OF THE INVENTION

An object of the present disclosure is to provide a display panel, wherein.

In a first aspect, an embodiment of the present disclosure provides a display panel. The display panel comprises a substrate, a first flexible layer, a first inorganic layer, and a second inorganic layer stacked from a bottom to a top; wherein a crack blocking structure is disposed on the first flexible layer, and the crack blocking structure includes a cutting portion and a concave portion located at two sides of the cutting portion; the concave portion includes an opening and a cavity extending from the opening toward an interior of the first flexible layer; the first inorganic layer and the second inorganic layer are disconnected at the opening of the concave portion, the concave portion is configured to block cracks of the first inorganic layer and the second inorganic layer from extending to two sides of the crack blocking structure when the cutting portion cuts the display panel.

In the display panel of the present disclosure, a length of the opening of the concave portion away from a side of the cutting portion to the cutting portion is greater than a sum of a deviation length and an reaction length, the deviation length is a length deviated after cutting the cutting portion, and the reaction length is a length generated heat in a horizontal direction after cutting the cutting portion.

In the display panel of the present disclosure, an opening length of the opening of the concave portion in a horizontal direction is greater than a sum of a vertical thickness of the first inorganic layer and a vertical thickness of the second inorganic layer, so that the first inorganic layer and the second inorganic layer extend into the cavity of the concave portion.

In the display panel of the present disclosure, a vertical length of the cavity of the concave portion is greater than a sum of a vertical thickness of the first inorganic layer and a vertical thickness of the second inorganic layer.

In the display panel of the present disclosure, a vertical length of the concave portion is less than a vertical thickness of the first flexible layer.

In the display panel of the present disclosure, a side wall of the cavity of the concave portion extends to two sides in a horizontal direction with respect to a central axis of the concave portion to form a sub-cavity, and the sub-cavity is configured to disconnect the first inorganic layer and the second inorganic layer in the cavity of the concave portion.

In the display panel of the present disclosure, a length of a bottom of the cavity of the concave portion in a horizontal direction is greater than a length of the opening of the concave portion in a horizontal direction.

In the display panel of the present disclosure, a thin film transistor and a light emitting component are further disposed between the first flexible layer and the first inorganic layer, the thin film transistor partially covers the first flexible layer, and the light emitting component is disposed on the thin film transistor.

In the display panel of the present disclosure, an organic encapsulation layer is disposed between the first inorganic layer and the second inorganic layer.

In the display panel of the present disclosure, the substrate includes a second flexible layer and an isolation layer disposed on the second flexible layer.

In the display panel of the present disclosure, the first inorganic layer and the second inorganic layer are made by a mask, and the mask is formed by welding a metal plate with an internal hollow and shielding strips partially blocking a binding portion of the display panel.

In a second aspect, an embodiment of the present disclosure provides a mask for making a display panel and configured to fabricate a first inorganic layer and a second inorganic layer of the display panel, wherein the mask comprises a metal plate with an internal hollow and a plurality of shielding strips, and two ends of each shielding strip are welded to a metal edge of the metal plate.

In the mask of the present disclosure, the shielding strips are perpendicular to the metal edge welded to both ends of each shielding strip, and the first inorganic layer and the second inorganic layer partially block a binding portion of the display panel to expose a binding position of the binding portion when the shielding strips are used to make the display panel.

In the mask of the present disclosure, the shielding strips are arranged in parallel with each other.

In a third aspect, an embodiment of the present disclosure provides a display device, and the display device comprises a housing and a display panel disposed on the housing, wherein the display panel comprises a substrate, a first flexible layer, a first inorganic layer, and a second inorganic layer stacked from a bottom to a top; wherein a crack blocking structure is disposed on the first flexible layer, and the crack blocking structure includes a cutting portion and a concave portion located at two sides of the cutting portion; the concave portion includes an opening and a cavity extending from the opening toward an interior of the first flexible layer; the first inorganic layer and the second inorganic layer are disconnected at the opening of the concave portion; the concave portion is configured to block cracks of the first inorganic layer and the second inorganic layer from extending to two sides of the crack blocking structure when the cutting portion cuts the display panel; the concave portion away from a side of the cutting portion to the cutting portion is greater than a sum of a deviation length and an reaction length, the deviation length is a length deviated after cutting the cutting portion, and the reaction length is a length generated heat in a horizontal direction after cutting the cutting portion; a vertical length of the concave portion is less than a vertical thickness of the first flexible layer.

In the display device of the present disclosure, an opening length of the opening of the concave portion in a horizontal direction is greater than a sum of a vertical thickness of the first inorganic layer and a vertical thickness of the second inorganic layer, so that the first inorganic layer and the second inorganic layer extend into the cavity of the concave portion.

In the display device of the present disclosure, a vertical length of the cavity of the concave portion is greater than a sum of a vertical thickness of the first inorganic layer and a vertical thickness of the second inorganic layer.

In the display device of the present disclosure, a side wall of the cavity of the concave portion extends to two sides in a horizontal direction with respect to a central axis of the concave portion to form a sub-cavity, and the sub-cavity is configured to disconnect the first inorganic layer and the second inorganic layer in the cavity of the concave portion.

In the display device of the present disclosure, a length of a bottom of the cavity of the concave portion in a horizontal direction is greater than a length of the opening of the concave portion in a horizontal direction.

In the display device of the present disclosure, a thin film transistor and a light emitting component are further disposed between the first flexible layer and the first inorganic layer, the thin film transistor partially covers the first flexible layer, and the light emitting component is disposed on the thin film transistor.

The present disclosure provides a display panel, and the display panel includes a substrate, a first flexible layer, a first inorganic layer, and a second inorganic layer stacked from a bottom to a top, wherein a crack blocking structure is disposed on the first flexible layer, and the crack blocking structure includes a cutting portion and a concave portion located at two sides of the cutting portion. The concave portion includes an opening and a cavity extending from the opening toward an interior of the first flexible layer. The first inorganic layer and the second inorganic layer are disconnected at the opening of the concave portion. The concave portion is configured to block cracks of the first inorganic layer and the second inorganic layer from extending to two sides of the crack blocking structure when the cutting portion cuts the display panel. Thereby reducing the risk of failure of the package, and due to the existence of the crack blocking structure, the mask for making the display panel does not need to be too occluded. It can reduce the complexity of the manufacturing process and the production cost, and improve the service life of the mask.

DESCRIPTION OF DRAWINGS

In order to more clearly illustrate the embodiments or prior art technical solutions embodiment of the present disclosure, will implement the following figures for the cases described in prior art or require the use of a simple introduction. Obviously, the following description of the drawings are only some of those of ordinary skill in terms of creative effort without precondition, you can also obtain other drawings based on these drawings embodiments of the present disclosure.

DETAILED DESCRIPTION OF THE PREFERRED EMBODIMENTS

Figure 1:
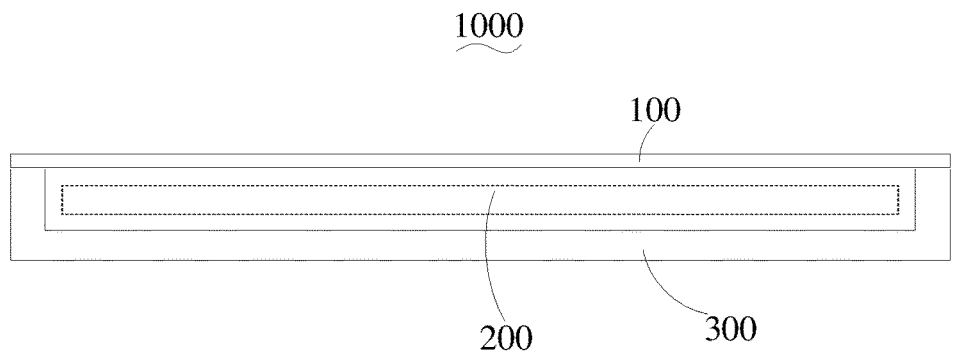
FIG. 1 is a schematic diagram of a display device according to an embodiment of the present disclosure.

Below in conjunction with the present disclosure, the embodiment of the drawings, the present invention embodiment of the technical solution will be clearly and completely described, obviously, the described embodiments are merely embodiments of invention part of, but not all embodiments example. Based on the embodiments of the present invention, all other embodiments of ordinary skill in the art without any creative effort shall fall within the scope of protection of the present invention.

In the description of the present application, be understood that the term "center", "longitudinal", "lateral", "length", "width", "upper", "thickness", "lower", "front", "rear", "left", "right", "vertical", "horizontal", "top", "bottom", "inner", "outer", "clockwise", "counterclockwise" and the like indicated orientation or positional relationship of the position or orientation on the relationship shown in the drawings, for convenience of description only and to simplify the description of the present application, not indicate or imply that the device or element referred to must have a particular orientation in a particular configuration and orientation operation, cannot be construed as limiting the present disclosure.

In addition, the terms "first", "second" are used to indicate or imply relative importance or the number of technical features specified implicitly indicated the purpose of description and should not be understood. Thus, there is defined "first", "second" features may be explicitly or implicitly included one or more of the features. In the description of the present disclosure, the meaning of "more" is two or more, unless specifically defined otherwise specifically.

In the present disclosure, unless otherwise expressly specified or limited, the terms "mounted," "connected," "connected," "fixed" and like terms are to be broadly understood, for example, may be a fixed connection, may be detachable connection, or integrally connected; may be a mechanical connector may be electrically connected; may be directly connected, can also be connected indirectly through intervening structures, it may be in communication the interior of the two elements. Those of ordinary skill in the art, to be understood that the specific meanings in the present disclosure according to specific situations.

In the present disclosure, unless otherwise expressly specified or limited, the first feature in the "on" or the second feature "Lower" may include direct contact with the first and second features may also include first and second feature is not in direct contact, but the contact by the additional features therebetween. Also, the first feature a second feature in the "on", "above", "upper" and includes obliquely upward directly above first feature a second feature, or only represents a first characteristic level is higher than the height of the second feature. In the first feature a second feature "beneath", "below" and "lower" above and includes a first positive feature obliquely upward in the second feature, or just less than the level represented by the first feature a second feature.

Following disclosure provides many different structures different embodiments or examples to implement the present disclosure. In order to simplify the disclosure of the present disclosure, be described hereinafter and set a specific example of the member. Of course, they are only illustrative, and are not intended to limit the present disclosure. Further, this application may be repeated in different examples reference numerals and/or letters reference, this is repeated for simplicity and clarity, and does not indicate a relationship between the various embodiments and/or set in question. Furthermore, the present disclosure provides examples of different processes and materials, but one of ordinary skill in the art may be appreciated that other processes and applications and/or other materials.

Embodiments of the present disclosure provide a display panel, a mask, and a display device, wherein the mask is used to make the display panel, the display panel can be integrated in the display device, and the display device can be a smart wearable device, a smart phone, a tablet computer, or a smart TV.

In prior art, a mask is usually used to make a display panel, and the mask of a conventional structure exposes only a portion of the display panel, and blocks other portions without the display panel. Therefore, positional accuracy and a blocking problem must be strictly controlled during preparation and use. When some units exceed the specifications, the mask will need to be replaced. The display panel is made of the mask of a conventional structure, and it is necessary to install a stopper to block the crack extension when cutting the display panel, and the manufacturing process is cumbersome.

The embodiment of the present disclosure provides a display device, and the display device comprises a housing and a display panel disposed on the housing. The display panel comprises a substrate, a first flexible layer, a first inorganic layer, and a second inorganic layer stacked from a bottom to a top; wherein a crack blocking structure is disposed on the first flexible layer, and the crack blocking structure includes a cutting portion and a concave portion located at two sides of the cutting portion; the concave portion includes an opening and a cavity extending from the opening toward an interior of the first flexible layer; the first inorganic layer and the second inorganic layer are disconnected at the opening of the concave portion; the concave portion is configured to block cracks of the first inorganic layer and the second inorganic layer from extending to two sides of the crack blocking structure when the cutting portion cuts the display panel; the concave portion away from a side of the cutting portion to the cutting portion is greater than a sum of a deviation length and an reaction length, the deviation length is a length deviated after cutting the cutting portion, and the reaction length is a length generated heat in a horizontal direction after cutting the cutting portion; a vertical length of the concave portion is less than a vertical thickness of the first flexible layer.

An opening length of the opening of the concave portion in a horizontal direction is greater than a sum of a vertical thickness of the first inorganic layer and a vertical thickness of the second inorganic layer, so that the first inorganic layer and the second inorganic layer extend into the cavity of the concave portion.

A vertical length of the cavity of the concave portion is greater than a sum of a vertical thickness of the first inorganic layer and a vertical thickness of the second inorganic layer.

A side wall of the cavity of the concave portion extends to two sides in a horizontal direction with respect to a central axis of the concave portion to form a sub-cavity, and the sub-cavity is configured to disconnect the first inorganic layer and the second inorganic layer in the cavity of the concave portion.

A length of a bottom of the cavity of the concave portion in a horizontal direction is greater than a length of the opening of the concave portion in a horizontal direction.

A thin film transistor and a light emitting component are further disposed between the first flexible layer and the first inorganic layer, the thin film transistor partially covers the first flexible layer, and the light emitting component is disposed on the thin film transistor.

Referring to FIG. 1, a schematic diagram of a display device according to an embodiment of the present disclosure is illustrated. The display device includes a display panel 100, a control circuit 200, and a housing 300. It should be noted that a display device 1000 shown in FIG. 1 is not limited to the above, and can further include other elements. For example, it also includes a camera, an antenna structure, or a pattern unlocking module. The display panel 100 is disposed on the housing 300.

In the embodiment, the display panel 100 is fixed to the housing 300, and the display panel 100 and the housing 300 form a closed space to accommodate elements, such as the control circuit 200.

In the embodiment, the housing 300 can be made of a flexible material, such as a plastic housing or a silicone housing.

The control circuit 200 is mounted in the housing 300, and the control circuit 200 is a main board of the display device 1000. The control circuit 200 is integrate one, two or more of a battery, an antenna structure, a microphone, a speaker, a headphone interface, a universal serial bus interface, a camera, a distance sensor, an ambient light sensor, a receiver, and a processor.

The display panel 100 is mounted in the housing 300, and the display panel 100 is electrically connected to the control circuit 200 to form a display surface of the display device 1000. The display panel 100 includes a display area and a non-display area, wherein the display area is used to display a screen of the display device 1000 or for a user to perform touch manipulation, and the non-display area is used to set various functional components.

Figure 2:
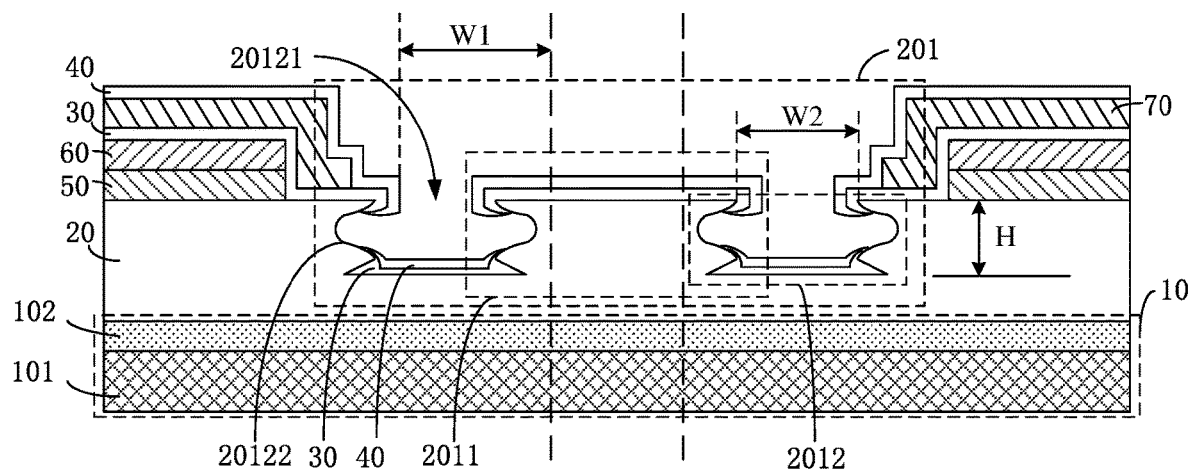
FIG. 2 is a schematic diagram of a display panel according to an embodiment of the present disclosure.
Figure 3:
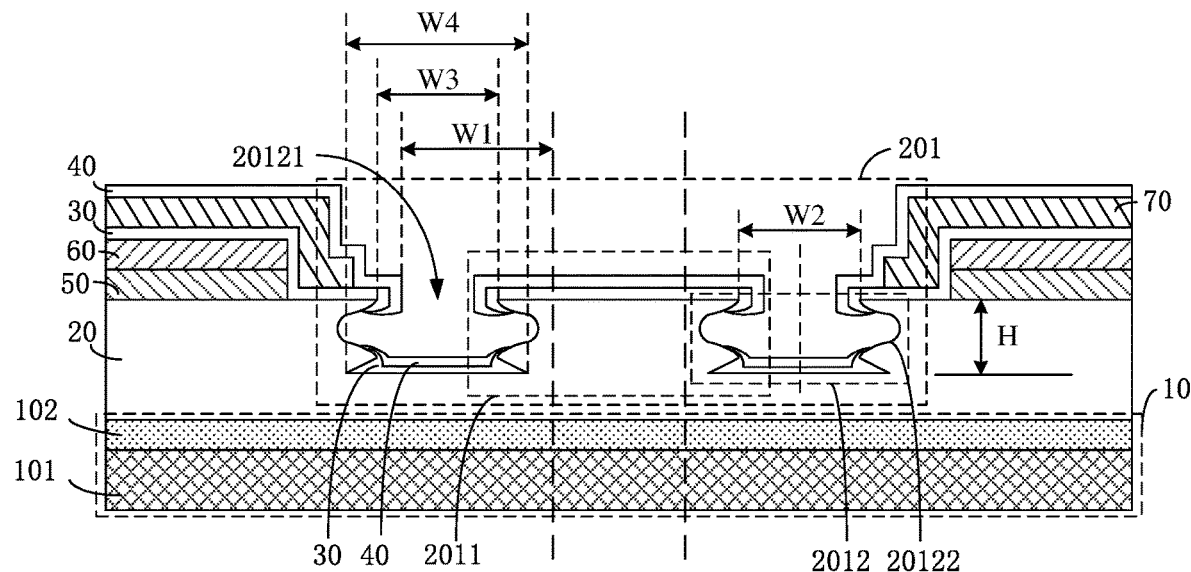
FIG. 3 is another schematic diagram of a display panel according to an embodiment of the present disclosure.

Referring to FIGS. 2 and 3, a schematic diagram and another schematic diagram of a display panel according to an embodiment of the present disclosure are illustrated.

The display panel 100 comprises a substrate 10, a first flexible layer 20, a first inorganic layer 30, and a second inorganic layer 40 stacked from a bottom to a top. A crack blocking structure 201 is disposed on the first flexible layer 20, and the crack blocking structure 201 includes a cutting portion 2011 and a concave portion 2012 located at two sides of the cutting portion 2011. The concave portion 2012 includes an opening 20121 and a cavity 20122 extending from the opening 20121 toward an interior of the first flexible layer 20. The first inorganic layer 30 and the second inorganic layer 40 are disconnected at the opening 20121 of the concave portion 2012. The concave portion 2012 is configured to block cracks of the first inorganic layer 30 and the second inorganic layer 40 from extending to two sides of the crack blocking structure 201 when the cutting portion 2011 cuts the display panel 100.

Specifically, the crack blocking structure 201 includes the cutting portion 2011 and the concave portion 2012 disposed on two sides of the cutting portion 2011. The opening 20121 of the concave portion 2012 is disposed on the surface of the first flexible layer 20, and the cavity 20122 is a receiving cavity formed by the opening 20121 extending toward the inside of the first flexible layer 20. When the first inorganic layer 30 and a second inorganic layer 40 are formed using a mask, and the mask are formed on the first flexible layer 20. The first inorganic layer 30 and the second inorganic layer 40 are disconnected at the opening 20121 of the concave portion 2012. The receiving cavity is for loading a portion where the first inorganic layer 30 and the second inorganic layer 40 are broken. When the display panel 100 is cut at the cutting portion 2011, the first inorganic layer 30, and the second inorganic layer 40 on the cutting portion 2011 are cracked and extend to the outside. After extending to the concave portion 2012, the concave portion 2012 prevents the crack from extending to two sides of the concave portion 2012.

The present disclosure provides a display panel, and the display panel includes a substrate 10, a first flexible layer 20, a first inorganic layer 30, and a second inorganic layer 40 stacked from a bottom to a top, wherein a crack blocking structure 201 is disposed on the first flexible layer 20, and the crack blocking structure 201 includes the cutting portion 2011 and the concave portion 2012 located at two sides of the cutting portion 2011. The concave portion 2012 includes the opening 20121 and the cavity 20122 extending from the opening 20121 toward an interior of the first flexible layer 30. The first inorganic layer 30 and the second inorganic layer 40 are disconnected at the opening 20121 of the concave portion 2012. The concave portion 2012 is configured to block cracks of the first inorganic layer 30 and the second inorganic layer 40 from extending to two sides of the crack blocking structure 201 when the cutting portion 2011 cuts the display panel 100. Thereby reducing the risk of failure of the package, and due to the existence of the crack blocking structure, the mask for making the display panel does not need to be too occluded. It can reduce the complexity of the manufacturing process and the production cost, and improve the service life of the mask.

In the embodiment, a length W1 of the opening 20121 of the concave portion 2012 away from a side of the cutting portion 2011 to the cutting portion 2011 is greater than a sum of a deviation length and an reaction length, wherein the deviation length is a length deviated after cutting the cutting portion 2011, and the reaction length is a length generated heat in a horizontal direction after cutting the cutting portion 2011.

Understandably, when the display panel 100 is cut, there is an error in accuracy due to the use of a mechanical arm or other cutting, and thus there is a cutting deviation. Moreover, the heat generated by the cutting also breaks the encapsulation layer on both sides of the crack blocking structure 201. Therefore, the length W1 should be greater than the deviation length and the reaction length generated the heat in a horizontal direction to prevent the influence of the heat generated by the cutting on the package structure on both sides of the concave portion 2012 and the resulting package failure.

In the embodiment, an opening length W3 of the opening 20121 of the concave portion 2012 in a horizontal direction is greater than a sum of a vertical thickness of the first inorganic layer 30 and a vertical thickness of the second inorganic layer 40, so that the first inorganic layer 30 and the second inorganic layer 40 extend into the cavity 20122 of the concave portion 2012.

In the embodiment, a vertical length of the cavity 20122 of the concave portion 2012 is greater than a sum of a vertical thickness of the first inorganic layer 30 and a vertical thickness of the second inorganic layer 40.

In the embodiment, a vertical length H of the concave portion 2012 is less than a vertical thickness of the first flexible layer 20.

Referring to FIG. 3, another schematic diagram of a display panel according to an embodiment of the present disclosure is illustrated. A side wall of the cavity 20122 of the concave portion 2012 extends to two sides in a horizontal direction with respect to a central axis of the concave portion 2012 to form a sub-cavity, and the sub-cavity is configured to disconnect the first inorganic layer 30 and the second inorganic layer 40 in the cavity 20122 of the concave portion 2012.

When the mask is formed on the first inorganic layer 30 and the second inorganic layer 40, the mask is formed vertically downward. If there is no sub-cavity, the first inorganic layer 30 and second inorganic layer 40 continue in the cavity 20122 of the concave portion 2012, causing the crack to extend during cutting. Therefore, the sub-cavity can be prevented from being continuously formed, so that the first inorganic layer 30 and second inorganic layer 40 are broken in the cavity 20122 of the concave portion 2012.

In the embodiment, a small portion of the first inorganic layer 30 and the second inorganic layer 40 are deposited on a bottom of the cavity 20122, and the second inorganic layer 40 is deposited on the first inorganic layer 30.

Figure 4:
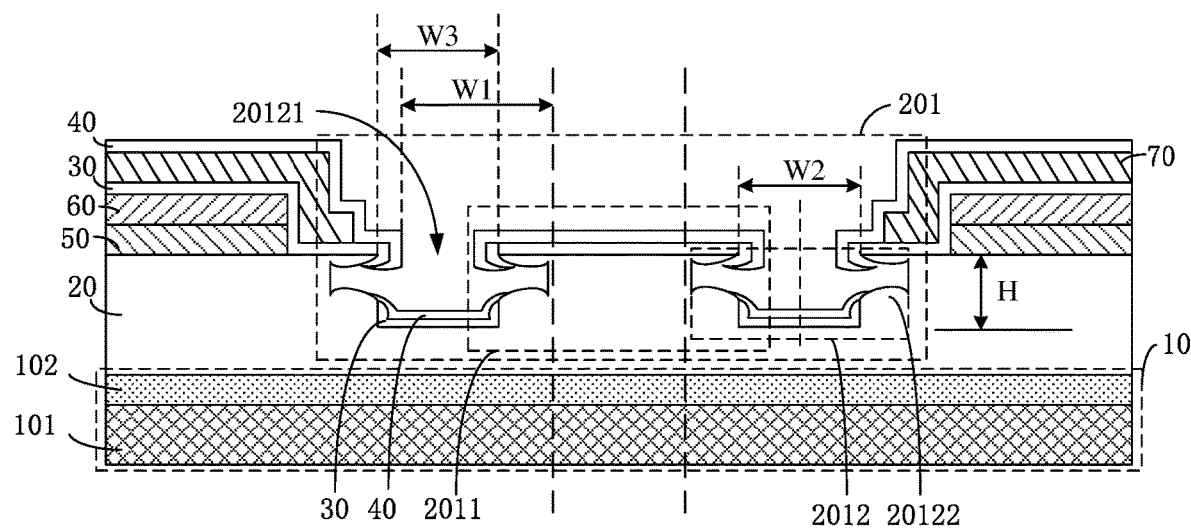
FIG. 4 is another schematic diagram of a display panel according to an embodiment of the present disclosure.

Referring to FIG. 4, another schematic diagram of a display panel according to an embodiment of the present disclosure is illustrated. The concave portion 2012 has a cross structure or other structure, which is not limited herein.

Figure 5:
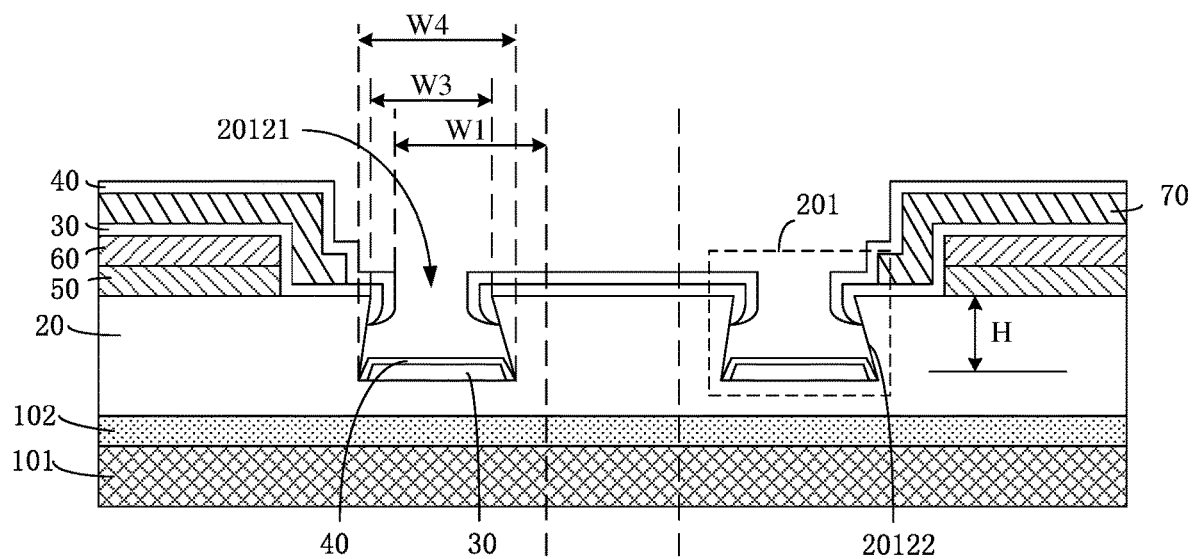
FIG. 5 is another schematic diagram of a display panel according to an embodiment of the present disclosure.

Referring to FIG. 5, another schematic diagram of a display panel according to an embodiment of the present disclosure is illustrated. As shown in FIGS. 2 and 5, a length W4 of a bottom of the cavity 20122 of the concave portion 2012 in a horizontal direction is greater than a length W3 of the opening 20121 of the concave portion 2012 in a horizontal direction.

Understandably, the length W4 of the bottom of the cavity 20122 in the horizontal direction is greater than the length W3 of the opening 20121 in the horizontal direction. This structure can be formed without providing the sub-cavity, and achieve the effect of breaking the first inorganic layer 30 and the second inorganic layer 40 in the concave portion 2012.

In the embodiment, a thin film transistor 50 and a light emitting device 60 are further disposed between the first flexible layer 20 and the first inorganic layer 30, the thin film transistor 50 partially covers the first flexible layer 20, and the light emitting device 60 is disposed on the thin film transistor 50.

In the embodiment, an organic encapsulation layer 70 is disposed between the first inorganic layer 30 and the second inorganic layer 40.

The first inorganic layer 30 and the second inorganic layer 40 are formed by chemical vapor deposition (CVD), and the thickness in the vertical direction is generally less than 1.5 micrometers. The organic encapsulation layer 70 is made by ink jet printing (IJP).

In the embodiment, the substrate 10 includes a second flexible layer 101 and an isolation layer 102 disposed on the second flexible layer 101.

The first flexible layer 20 and the second flexible layer 101 are selected from high temperature resistant organic materials, such as polyimide spin coating, blade coating, or other high temperature resistant organic materials. It is not limited herein. The isolation layer 102 is a silicon oxide inorganic isolation layer.

Figure 6:
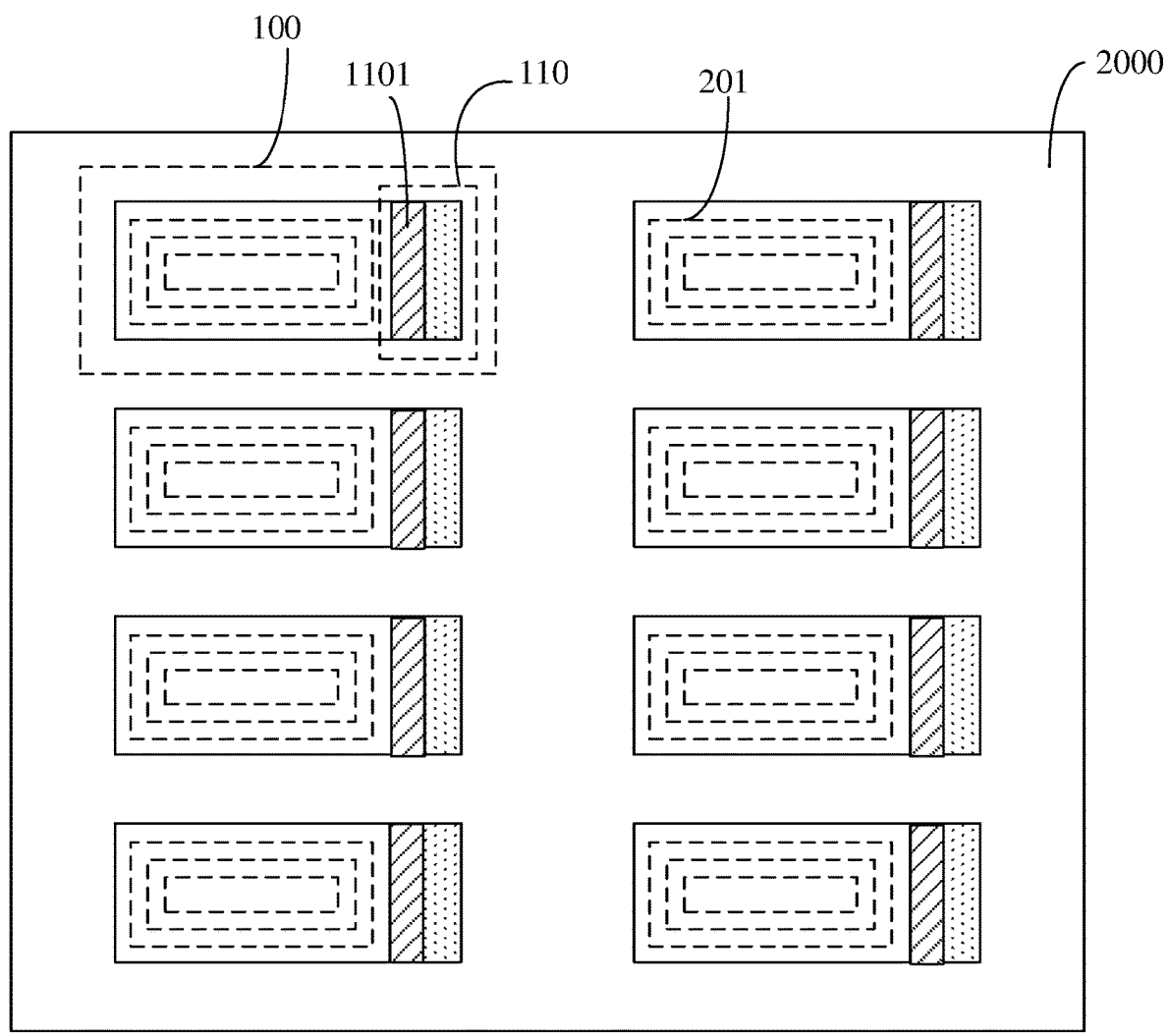
FIG. 6 is a top view of a board composed of a plurality of display panels according to an embodiment of the present disclosure.
Figure 7:
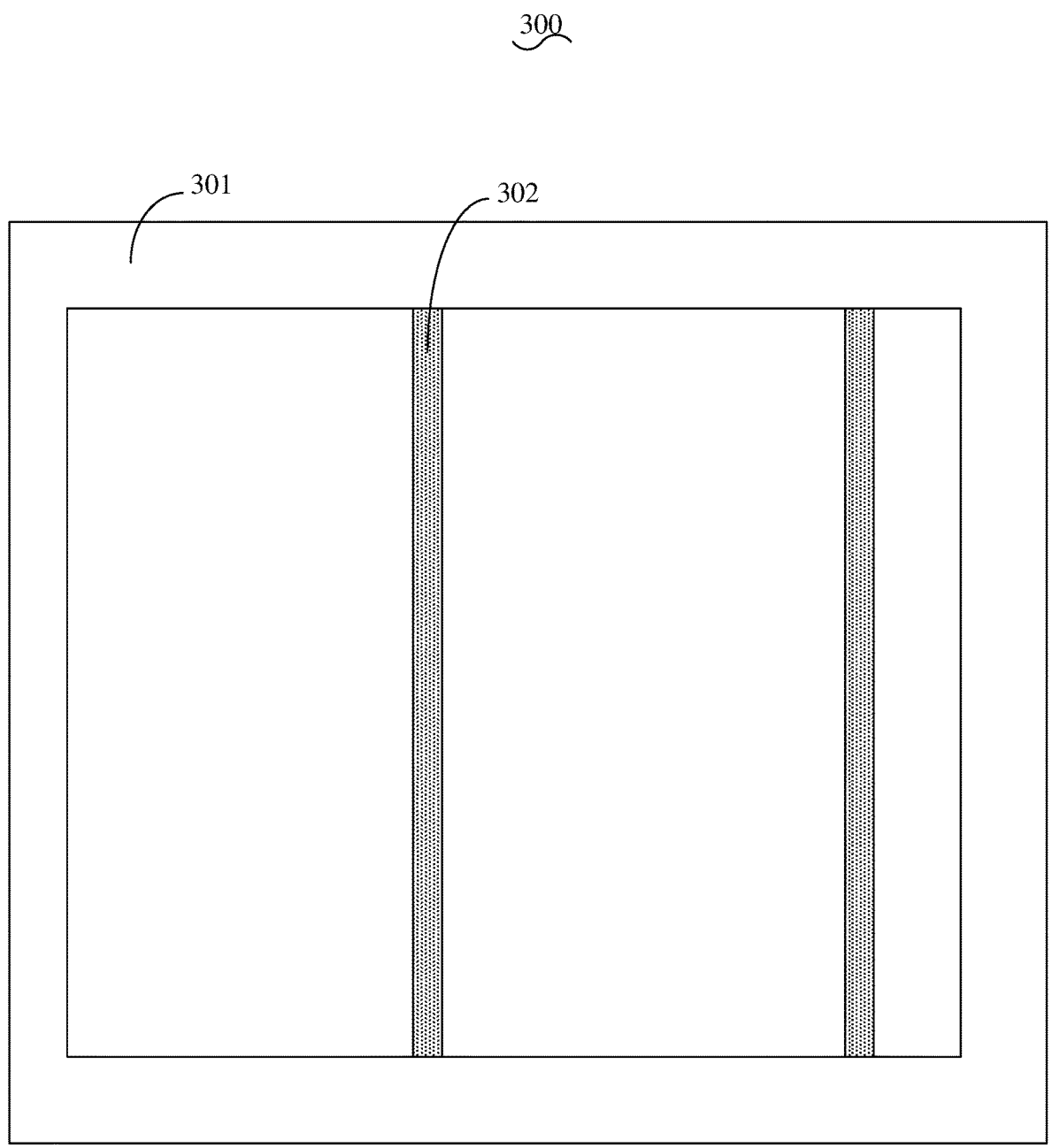
FIG. 7 is a mask for manufacturing a display panel according to an embodiment of the present disclosure.

Referring to FIGS. 6 and 7, a top view of a board composed of a plurality of display panels and a mask for manufacturing a display panel according to an embodiment of the present disclosure are illustrated. The first inorganic layer 30 and the second inorganic layer 40 are made by a mask 300, and the mask 300 is formed by welding a metal plate 301 with an internal hollow and shielding strips 302 partially blocking a binding portion 110 of the display panel 100.

In actual production, a plurality of identical display panels 100 are formed on a main board 2000, and the identical display panels 100 are further cut into a single display panel 100. As shown in FIG. 7, the mask 300 is used to mask each of the display panels 100 in the main board 2000 because the display panel 100 has a crack blocking structure 201. Therefore, the mask 300 does not need to block the entire area of the non-display panel 100, and only the binding portion 110 of the display panel 100 is partially blocked.

The present disclosure provides a display panel, and the display panel includes a substrate 10, a first flexible layer 20, a first inorganic layer 30, and a second inorganic layer 40 stacked from a bottom to a top, wherein a crack blocking structure 201 is disposed on the first flexible layer 20, and the crack blocking structure 201 includes a cutting portion 2011 and a concave portion 2012 located at two sides of the cutting portion 2011. The concave portion 2012 includes an opening 20121 and a cavity 20122 extending from the opening 20121 toward an interior of the first flexible layer 30. The first inorganic layer 30 and the second inorganic layer 40 are disconnected at the opening 20121 of the concave portion 2012. The concave portion 2012 is configured to block cracks of the first inorganic layer 30 and the second inorganic layer 40 from extending to two sides of the crack blocking structure 201 when the cutting portion 2011 cuts the display panel 100. Thereby reducing the risk of failure of the package, and due to the existence of the crack blocking structure, the mask for making the display panel does not need to be too occluded. It can reduce the complexity of the manufacturing process and the production cost, and improve the service life of the mask.

In order to further describe the present disclosure, the following description will be made from the method for manufacturing the display panel.

Providing a substrate, placing a plurality of molds on the substrate, and fabricating a first flexible layer on the substrate, and the plurality of molds are configured to prepare a crack blocking structure. Removing the plurality of molds before the first flexible layer is cured. Providing a thin film transistor partially to cover the first flexible layer on the cured first flexible layer. Forming a light emitting device on the thin film transistor to obtain a light emitting panel to be packaged. Performing a packaging process on the light emitting panel to package and obtain a display panel.

The present disclosure provides a method for manufacturing the display panel, and the method is applied to the display device. The display panel includes a substrate, a first flexible layer, a first inorganic layer, and a second inorganic layer stacked from bottom to top, wherein a crack blocking structure is disposed on the first flexible layer, and the crack blocking structure includes a cutting portion and a concave portion located at two sides of the cutting portion; the concave portion includes an opening and a cavity extending from the opening toward an interior of the first flexible layer; the first inorganic layer and the second inorganic layer are disconnected at the opening of the concave portion; the concave portion is configured to block cracks of the first inorganic layer and the second inorganic layer from extending to two sides of the crack blocking structure when the cutting portion cuts the display panel. Thereby reducing the risk of failure of the package, and due to the existence of the crack blocking structure, the mask for making the display panel does not need to be too occluded. It can reduce the complexity of the manufacturing process and the production cost, and improve the service life of the mask.

The present disclosure further provides a mask 300 for manufacturing the above display panel 100. The mask 300 is configured to fabricate a first inorganic layer 30 and a second inorganic layer 40 of the display panel 100. The mask 300 includes a metal plate 301 with an internal hollow and a plurality of shielding strips 302, and two ends of each of the shielding strips 302 are welded to a metal edge of the metal plate 301.

In the embodiment, the shielding strips 302 are perpendicular to the metal edge welded to both ends of each of the shielding strips 302. The first inorganic layer 30 and the second inorganic layer 40 partially block a binding portion 110 of the display panel to expose a binding position 1101 of the binding portion 110 when the shielding strips 302 are used to make the display panel 100.

In the embodiment, the shielding strips 302 are arranged in parallel with each other.

The present disclosure provides a mask 300 configured to fabricate a first inorganic layer 30 and a second inorganic layer 40 of the display panel 100. The mask 300 is configured to fabricate a first inorganic layer 30 and a second inorganic layer 40 of the display panel 100. The mask 300 includes a metal plate 301 with an internal hollow and a plurality of shielding strips 302, and two ends of each shielding strip 302 are welded to a metal edge of the metal plate 301. The structure of the mask is simplified, the manufacturing difficulty and cost are reduced, the precision of the mask and the requirements of the mask are reduced, and the service life of the mask is improved.

The present disclosure has been described with preferred embodiments thereof and it is understood that many changes and modifications to the described embodiments can be carried out without departing from the scope and the spirit of the disclosure that is intended to be limited only by the appended claims.

What is claimed is:

1. A display panel, comprising:
   a substrate, a first flexible layer, a first inorganic layer, and a second inorganic layer stacked from bottom to top;
   wherein a crack blocking structure is disposed on the first flexible layer, and the crack blocking structure includes a cutting portion and a concave portion located at two sides of the cutting portion; the concave portion includes an opening and a cavity extending from the opening toward an interior of the first flexible layer; the first inorganic layer and the second inorganic layer are disconnected at the opening of the concave portion; the concave portion is configured to block cracks of the first inorganic layer and the second inorganic layer from extending to two sides of the crack blocking structure when the cutting portion cuts the display panel.

2. The display panel according to claim 1, wherein a length of the opening of the concave portion away from a side of the cutting portion to the cutting portion is greater than a sum of a deviation length and a reaction length, the deviation length is a length deviated after cutting the cutting portion, and the reaction length is a length generated heat in a horizontal direction after cutting the cutting portion.

3. The display panel according to claim 2 wherein an opening length of the opening of the concave portion in a horizontal direction is greater than a sum of a vertical thickness of the first inorganic layer and a vertical thickness of the second inorganic layer, so that the first inorganic layer and the second inorganic layer extend into the cavity of the concave portion.

4. The display panel according to claim 3, wherein a vertical length of the cavity of the concave portion is greater than a sum of a vertical thickness of the first inorganic layer and a vertical thickness of the second inorganic layer.

5. The display panel according to claim 1, wherein a vertical length of the concave portion is less than a vertical thickness of the first flexible layer.

6. The display panel according to claim 1, wherein a side wall of the cavity of the concave portion extends to two sides in a horizontal direction with respect to a central axis of the concave portion to form a sub-cavity, and the sub-cavity is configured to disconnect the first inorganic layer and the second inorganic layer in the cavity of the concave portion.

7. The display panel according to claim 1, wherein a length of a bottom of the cavity of the concave portion in a horizontal direction is greater than a length of the opening of the concave portion in a horizontal direction.

8. The display panel according to claim 1, wherein a thin film transistor and a light emitting component are further disposed between the first flexible layer and the first inorganic layer, the thin film transistor partially covers the first flexible layer, and the light emitting component is disposed on the thin film transistor.

9. The display panel according to claim 1, wherein an organic encapsulation layer is disposed between the first inorganic layer and the second inorganic layer.

10. The display panel according to claim 1, wherein the substrate includes a second flexible layer and an isolation layer disposed on the second flexible layer.

11. The display panel according to claim 1, wherein the first inorganic layer and the second inorganic layer are made by a mask, and the mask is formed by welding a metal plate with an internal hollow and shielding strips partially blocking a binding portion of the display panel.

12. A mask for making a display panel and configured to fabricate a first inorganic layer and a second inorganic layer of the display panel, wherein the mask comprises:
a metal plate with an internal hollow and a plurality of shielding strips, and two ends of each of the shielding strips are welded to a metal edge of the metal plate.

13. The mask for making the display panel according to claim 12, wherein the shielding strips are perpendicular to the metal edge welded to both ends of each of the shielding strips, and the first inorganic layer and the second inorganic layer partially block a binding portion of the display panel to expose a binding position of the binding portion when the shielding strips are used to make the display panel.

14. The mask for making the display panel according to claim 13, wherein the shielding strips are arranged in parallel with each other.

15. A display device comprising a housing and a display panel disposed on the housing, wherein the display panel comprises:
a substrate, a first flexible layer, a first inorganic layer, and a second inorganic layer stacked from bottom to top;
wherein a crack blocking structure is disposed on the first flexible layer, and the crack blocking structure includes a cutting portion and a concave portion located at two sides of the cutting portion; the concave portion includes an opening and a cavity extending from the opening toward an interior of the first flexible layer; the first inorganic layer and the second inorganic layer are disconnected at the opening of the concave portion; the concave portion is configured to block cracks of the first inorganic layer and the second inorganic layer from extending to two sides of the crack blocking structure when the cutting portion cuts the display panel;
the concave portion away from a side of the cutting portion to the cutting portion is greater than a sum of a deviation length and a reaction length, the deviation length is a length deviated after cutting the cutting portion, and the reaction length is a length generated heat in a horizontal direction after cutting the cutting portion;
a vertical length of the concave portion is less than a vertical thickness of the first flexible layer.

16. The display device according to claim 15, wherein an opening length of the opening of the concave portion in a horizontal direction is greater than a sum of a vertical thickness of the first inorganic layer and a vertical thickness of the second inorganic layer, so that the first inorganic layer and the second inorganic layer extend into the cavity of the concave portion.

17. The display device according to claim 16, wherein a vertical length of the cavity of the concave portion is greater than a sum of a vertical thickness of the first inorganic layer and a vertical thickness of the second inorganic layer.

18. The display device according to claim 15, wherein a side wall of the cavity of the concave portion extends to two sides in a horizontal direction with respect to a central axis of the concave portion to form a sub-cavity, and the sub-cavity is configured to disconnect the first inorganic layer and the second inorganic layer in the cavity of the concave portion.

19. The display device according to claim 15, wherein a length of a bottom of the cavity of the concave portion in a horizontal direction is greater than a length of the opening of the concave portion in a horizontal direction.

20. The display device according to claim 15, wherein a thin film transistor and a light emitting component are further disposed between the first flexible layer and the first inorganic layer, the thin film transistor partially covers the first flexible layer, and the light emitting component is disposed on the thin film transistor.

* * * * *